(12) United States Patent
Thallner

(10) Patent No.: US 7,722,350 B2
(45) Date of Patent: May 25, 2010

(54) APPARATUS FOR IMPRINTING AND/OR EMBOSSING SUBSTRATES

(76) Inventor: Erich Thallner, Bubing 71, 4782 St. Florian (AT)

( * ) Notice: Subject to any disclaimer, the term of this patent is extended or adjusted under 35 U.S.C. 154(b) by 0 days.

(21) Appl. No.: 12/099,218

(22) Filed: Apr. 8, 2008

(65) Prior Publication Data
US 2008/0267743 A1  Oct. 30, 2008

(30) Foreign Application Priority Data
Apr. 24, 2007 (DE) .................. 10 2007 019 268

(51) Int. Cl.
*B29C 59/00* (2006.01)
(52) U.S. Cl. .................. 425/385; 264/293; 425/405.1
(58) Field of Classification Search ............... 425/385, 425/405.1; 264/293
See application file for complete search history.

(56) References Cited

U.S. PATENT DOCUMENTS 6,353,219 B1   3/2002   Kley ..................... 250/234
2003/0159608 A1*  8/2003   Heidari ................. 101/494
2004/0131718 A1*  7/2004   Chou et al. ............. 425/385
2006/0043626 A1   3/2006   Wu et al. ................ 264/101
2006/0286193 A1   12/2006  Ando et al. ............. 425/385
2008/0041248 A1   2/2008   Kuwabara et al. ........ 101/93.03

FOREIGN PATENT DOCUMENTS

DE   10 2004 055 223   7/2005

OTHER PUBLICATIONS

R. Islam et al., "One Micron Precision Optically Aligned Method for Hot-Embossing and Nanoimprinting," © 2002 IEEE, pp. 931-935.

* cited by examiner

*Primary Examiner*—Maria Veronica D Ewald
(74) *Attorney, Agent, or Firm*—Kusner & Jaffe

(57) ABSTRACT

The invention relates to an apparatus for imprinting and/or embossing substrates (7), in particular semiconductor substrates or wafers, having:
  a receiving unit (5) for receiving the substrate (7) in a working space (13),
  an adjusting device (2, 3, 4) for adjusting the substrate (7) in relation to an embossing and/or printing punch (10), whereby for a process that is as contamination-free as possible and for a manufacture of the apparatus that is as favorable as possible the receiving unit (5) is designed so as to separate the working space (13) from the environment.

14 Claims, 1 Drawing Sheet

APPARATUS FOR IMPRINTING AND/OR EMBOSSING SUBSTRATES

FIELD OF THE INVENTION

The invention relates to an apparatus for imprinting and/or embossing substrates (7), in particular semiconductor substrates or wafers, having:
- a receiving unit (5) for receiving the substrate (7) in a working space (13),
- an adjusting device (2, 3, 4) for adjusting the substrate (7) in relation to an embossing and/or printing punch (10).

BACKGROUND OF THE INVENTION

In the stated processes with punch transfer onto a substrate, such as micro contact printing (μCP), for example, and also embossing processes and/or printing processes for producing semiconductor substrates, in many cases it is necessary to cause the punching operation to take place in a defined atmosphere—such as a shielding-gas atmosphere, for example—or in a vacuum or partial vacuum. Since an adjustment/positioning of the semiconductor substrates relative to the punch is required, hitherto adjusting devices have been arranged within a chamber that is capable of having the defined atmosphere applied to it.

By reason of the—in some cases—very large diameters of the semiconductor substrates that, for example, are punched in the step-and-repeat process, in some cases these adjusting devices exhibit considerable dimensions, since an exact adjustment/positioning in all three directions is required, with—in some cases—considerable displacement of the semiconductor substrates. The greater the volume of the chamber, the more stably does the apparatus have to be constructed, and with considerable wall thicknesses, in order to withstand the sometimes appreciable differences in pressure.

Furthermore, there is the problem that the control lines required for the adjusting device have to be guided out of the chamber, in which connection a sealing in relation to the chamber has to be guaranteed. In addition, there is the problem that the adjusting device has to operate in highly precise manner in various atmospheres and under various pressures.

SUMMARY OF THE INVENTION

An advantage of the invention is an apparatus that operates in a manner as free from contamination as possible and that can be manufactured inexpensively.

This advantage is achieved with the features of Claim 1.

Further advantages of the invention are specified in the dependent claims.

The basic idea of the present invention is to bring about the displacement/positioning/adjustment of the substrate in relation to the punch from outside the chamber delimiting a working space. This entails the advantage that the adjusting device can be operated outside the chamber and hence independently of the atmosphere within the chamber. The dimensions of the chamber may therefore be significantly smaller.

This basic idea can be realised by, for example, a lower part of the chamber being designed as a receiving device for the substrate, acting in supporting manner against an upper part of the chamber that includes the punch unit, and by the two parts of the chamber being displaceable in a plane in relation to one another by means of the adjusting device.

The part of the chamber receiving the punch is preferably not displaceable in the X-direction or Y-direction, whereas the punch is displaceable in the Z-direction in relation to this part of the chamber. Depending on the particular application, the punch may also rotate or may be supported so as to be displaceable in the X-direction and/or Y-direction. On the other hand, the part of the chamber receiving the substrate is displaceable in the X-direction and Y-direction but not in the Z-direction—if really necessary by slight displacement of the two parts of the chamber relative to one another, for example by disengaging or activating a fluid bearing which is described further below.

The expression "X-direction and Y-direction" means two directions oriented orthogonally to one another, spanning a plane parallel to the surface of the substrate. The Z-direction is orthogonal to this plane.

In its most general embodiment, the receiving unit is designed so as to separate the working space from the environment. The expression "so as to separate" in this connection means that fluid located in the working space is unable to escape unintentionally. Any flowable medium—that is to say, for example, a gaseous and/or liquid medium, including a vacuum—is subsumed under the term "fluid" in the sense of the present invention.

The punch and the substrate are accordingly capable of having a vacuum and/or a defined atmosphere applied to them in a separate working space.

Inasmuch as the separate working space is constituted by a superstructure receiving the punch, by an adjusting plate and by a receiving unit receiving the substrate, the working space is formed with as few components as possible and, by virtue of this, is formed as small as possible, and a stable structural design can be guaranteed.

The term "working space" in the sense of the invention is understood to mean the space in which the essential process—namely the embossing or imprinting of the substrate by the punch—takes place.

The adjusting device is with advantage arranged at least partially, preferably completely, outside the working space. Also within the scope of the invention is an embodiment in which, for example, only one direction of motion, and hence, for example, only one adjusting device operating in the X-direction or Y-direction, is arranged outside the working space and the receiving unit receiving the substrate is guided in relation to the superstructure receiving the punch, for example by means of a gear-tooth system or a tongue-and-groove joint, so that a displacement of the receiving unit in relation to the superstructure is possible in only one direction.

It is particularly advantageous to provide between the receiving unit, in particular the trough-shaped receiving unit, and the adjusting plate a fluid bearing that is fed with fluid, in particular air, preferably clean air, by at least one fluid feed line. By virtue of such a fluid bearing, a virtually friction-free displacement of the receiving unit relative to the adjusting plate of the superstructure is possible, as a result of which a highly precise adjustment is realised with as little expenditure of force as possible.

In comparison with a contact-guided connection between the receiving unit and the adjusting plate, there is the advantage, moreover, that abraded particles, and hence contaminations in the working space, are avoided. Any pollution of the atmosphere in the working space impairs the embossing or printing process.

Inasmuch as the receiving unit is formed, in particular in one piece, from a receiving floor and a peripheral shoulder, with the peripheral shoulder exhibiting a front face protruding from the receiving floor, said front face being situated opposite a flat contact face of the adjusting plate, a guidance of the substrate relative to the punch, directed parallel to one another, can be realised surprisingly easily, the contact faces being oriented, or capable of being oriented, parallel to the receiving floor and also parallel to the front face.

In a particularly advantageous configuration of the invention the working space is capable of having a defined vacuum applied to it by means of a vacuum device via a vacuum line, and fluid that is present in the working space, as well as fluid entering the working space from the fluid feed line, is capable of being drained away via the vacuum line. Hence a defined pressure can be set in the working space.

Inasmuch as a drainage quantity A of fluid Fv and fluid Fz drained away via the vacuum line corresponds substantially to a feed quantity fed via the fluid feed line after a defined vacuum has been set in the working space, the drained quantity and fed quantity of fluid are in equilibrium after the defined vacuum has been set, and the vacuum is constant.

The air escaping into the working space from the fluid bearing is small in volume in relation to the pump output of the vacuum system, so that a constant vacuum can be maintained.

BRIEF DESCRIPTION OF THE DRAWING

Further advantages and expedient embodiments of the invention are reproduced in the remaining claims, in the Figures, in the description and in the drawings.

DETAILED DESCRIPTION OF PREFERRED EMBODIMENT

Figure 1:
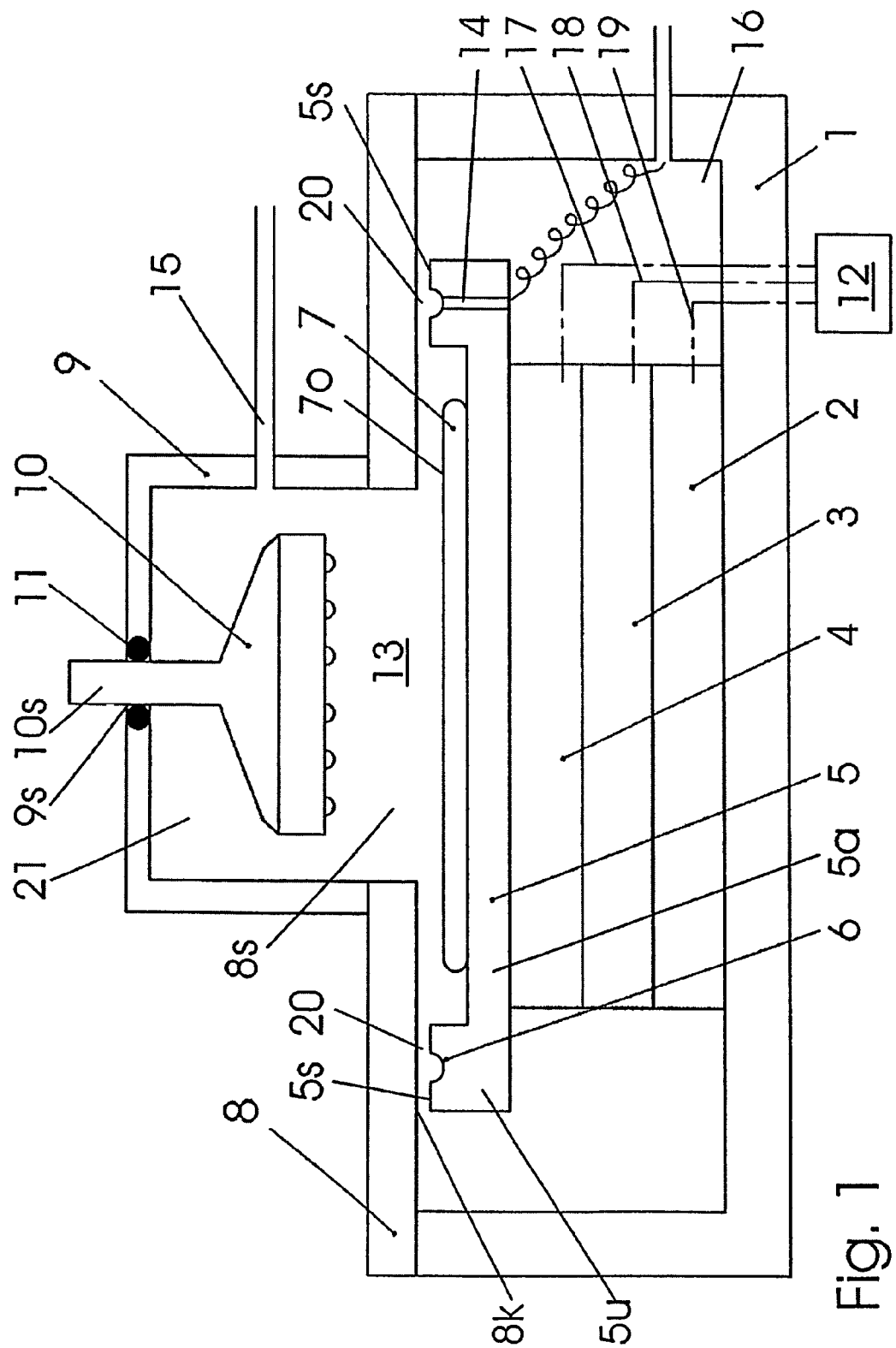
FIG. 1 shows a sectional, schematic side view of the apparatus according to the invention.

In the single FIGURE an apparatus according to the invention for imprinting and/or embossing a semiconductor substrate 7 is represented with a substructure 1 and also with an adjusting device 2, 3, 4 for adjusting the semiconductor substrate 7 in relation to a punch 10.

The substructure 1 may be open or closed and essentially performs the task of stably supporting or fixing an adjusting plate 8. The adjusting device 2, 3, 4 is arranged within the space 16 delimited by the substructure 1, and in the embodiment shown in FIG. 1 said device is fixed to the substructure 1.

The adjusting device 2, 3, 4 consists of a relocating unit in the X-direction 2 and a relocating unit in the Y-direction 3 and also a rotating unit 4. The relocating unit in the X-direction 2 is responsible for the relocation in the X-direction, i.e. in the plane of the drawing to the left and to the right, of a receiving unit 5 arranged above the adjusting device 2, 3, 4. The relocating unit in the Y-direction 3 serves for relocating the receiving unit 5 in the Y-direction, i.e. in FIG. 1 into the plane of the drawing and out of the plane of the drawing. The rotating unit 4 provides for a rotation of the receiving unit 5 in the plane E spanned by the X-direction and Y-direction.

Control of the adjusting device 2, 3, 4 is effected by means of a control device 12 which is connected to the relocating units 2, 3 and to the rotating unit 4 via control lines 19, 18 and 17, it being possible for the control device 12 to be arranged within the space 16 or outside the substructure 1.

The receiving unit 5 consists of a receiving floor 5a and also of a peripheral shoulder 5u which protrudes in the direction of the adjusting plate 8 and extends over the entire periphery of the receiving floor 5a. The receiving unit 5 is, as a result, trough-shaped, in which connection the peripheral shoulder 5u in a top view may be configured in a circular shape or in the form of a polygon, in particular a rectangle, but is preferably configured so as to be congruent in shape to the periphery of the semiconductor substrate 7.

The peripheral shoulder 5u exhibits a front face 5s pointing in the direction of the adjusting plate 8, which is oriented plane-parallel to the flat side of the adjusting plate 8 pointing in the direction of the front face 5s and, in particular, plane-parallel to the plane E. The flat side of the adjusting plate 8 pointing in the direction of the front face 5s exhibits a contact face 8k, along which the receiving unit 5 with its front face 5s is displaceable, whereby a contact of the front face 5s with the contact face 8k is avoided by means of a fluid bearing 20 formed between the contact face 8k and the front side 5s, as a result of which a practically friction-free sliding of the receiving unit 5 parallel to the adjusting plate 8 is possible. The receiving unit 5 is configured in such a way that the surface 7o of the semiconductor substrate 7 is oriented parallel to the adjusting plate 8 or, to be more exact, to the plane E.

The adjusting plate 8 exhibits a punch opening 8s arranged above the surface 7o of the semiconductor substrate 7 to be processed, through which the punch 10 can be lowered onto the semiconductor substrate 7 in the Z-direction.

The punch 10 is capable of moving up and down within a superstructure 9 holding the punch 10 and within a space 21 formed by the superstructure 9, the upward and downward motion being brought about by an actuating device which is not represented and which is preferably located outside the superstructure 9. The force from the actuating device is transmitted via a punch stem 10s, which is guided by a punch packing 11 in a punch-stem opening 9s in the superstructure 9, and passes through said opening.

The motion of the punch 10 is coordinated with the adjusting device 2, 3, 4, preferably by means of the control device 12.

A working space 13, in which the punching process essentially takes place, is delimited by the receiving device 5, the fluid bearing 20, the adjusting plate 8 and the superstructure 9. The adjusting device 2, 3, 4 is accordingly arranged outside the working space 13.

The defined atmosphere required in the working space 13—such as, for example, a vacuum or partial vacuum with clean air—is generated by feeding an appropriate fluid Fz, which is fed via the fluid feed line 14, into the working space 13 via the fluid bearing 20 and by draining away fluid Fv and also fluid Fz located in the working space 13 via a vacuum line 15 and a vacuum system (not shown) connected thereto, whereby after a defined pressure in the working space 13 has been set the drainage quantity A of fluid Fv and fluid Fz is equal to the feed quantity Z of fluid Fz. After the equilibrium has been set, within a short time only the fluid Fz supplied via the fluid feed line 14 will be present in the working space 13.

The fluid bearing 20 is configured by means of openings 6 distributed as uniformly as possible over the front face 5s in such a way that the fluid bearing 20 makes available a pressure or volumetric flow of fed fluid Fz that is as homogeneous as possible over the entire front face 5s. By way of opening 6, a slot extending over the entire periphery may also be provided, which is fed via at least one fluid feed line 14, preferably via several fluid feed lines 14 distributed uniformly on the periphery of the receiving unit 5.

This structure entails the particular advantage that any impurities or contaminations in the working space 13 are transported out of the working space 13 in the constant current of fluid from the fluid feed line 14 to the vacuum line 15.

The invention claimed is:

1. An apparatus for imprinting and/or embossing substrates (7), in particular semiconductor substrates or wafers, having:
   an upper part for receiving an embossing and/or printing punch (10), a receiving unit (5) for receiving the substrate (7) in a working space (13), an adjusting device (2, 3, 4) for adjusting the substrate (7) in relation to the embossing and/or printing punch (10), characterised in that the receiving unit (5) is designed so as to separate the working space (13) from the environment, wherein the upper part is comprised of a superstructure (9) receiving the punch (10) and an adjusting plate (8), and wherein a fluid bearing (20), which is fed with fluid (Fz) by at least one fluid feed line (14), is provided between the receiving unit (5) and the adjusting plate (8).

2. Apparatus according to claim 1, wherein the separate working space (13) is capable of having a defined atmosphere applied to it.

3. Apparatus according to claims 1 or 2, wherein the adjusting device (2, 3, 4) is arranged at least partially outside the working space (13).

4. Apparatus according to claim 1, wherein the receiving unit (5) is formed from a receiving floor (5a) and a peripheral shoulder (5u), the peripheral shoulder (5u) exhibiting a front face (5s) protruding from the receiving floor (5a), which is situated opposite a flat contact face (8k) of the adjusting plate (8).

5. Apparatus according to claim 4, wherein the contact face (8k) is oriented, or capable of being oriented, parallel to the receiving floor (5a) and also parallel to the front face (5s).

6. Apparatus according claim 1, wherein the working space (13) is capable of having a defined vacuum applied to it via a vacuum line (15) by means of a vacuum device, and fluid (Fv) that is present in the working space (13) and also fluid (Fz) entering the working space from the fluid feed line (14) is capable of being drained away via the vacuum line (15).

7. Apparatus according to claim 6, wherein after a defined vacuum has been set in the working space (13) a drainage quantity (A) of fluid (Fv) and fluid (Fz) drained away via the vacuum line (15) corresponds substantially to a feed quantity (Z) fed via the fluid feed line (14).

8. Apparatus according to claim 2, wherein the defined atmosphere is a vacuum.

9. Apparatus according to claim 2, wherein the defined atmosphere is a partial vacuum.

10. Apparatus according to claim 2, wherein the defined atmosphere is clean air.

11. Apparatus according to claim 1, wherein the fluid (Fz) is air.

12. Apparatus according to claim 1, wherein the fluid (Fz) is clean air.

13. Apparatus according to claim 1, wherein the receiving unit (5) is trough-shaped.

14. Apparatus according to claim 4, wherein the receiving unit (5) is one piece.

* * * * *